(12) United States Patent
Zamprogno et al.

(10) Patent No.: US 10,541,692 B1
(45) Date of Patent: Jan. 21, 2020

(54) SUB-CLOCK CURRENT PULSE GENERATOR

(71) Applicants: STMicroelectronics S.r.l., Agrate Brianza (MB) (IT); Politecnico Di Milano, Milan (IT)

(72) Inventors: Marco Zamprogno, Cesano Maderno (IT); Alireza Tajfar, Leuven (BE)

(73) Assignees: STMicroelectronics S.r.l., Agrate Brianza (MB) (IT); Politecnico Di Milano, Milan (IT)

( * ) Notice: Subject to any disclaimer, the term of this patent is extended or adjusted under 35 U.S.C. 154(b) by 0 days.

(21) Appl. No.: 16/455,222

(22) Filed: Jun. 27, 2019

(51) Int. Cl.
  *H03L 7/08* (2006.01)
  *H03L 7/081* (2006.01)
  *H03L 7/089* (2006.01)
  *H03K 5/134* (2014.01)
  *H03K 5/00* (2006.01)

(52) U.S. Cl.
  CPC ........... *H03L 7/0812* (2013.01); *H03K 5/134* (2014.07); *H03L 7/0891* (2013.01); *H03K 2005/00019* (2013.01); *H03K 2005/00195* (2013.01)

(58) Field of Classification Search
  USPC ................................. 327/147–149, 156–158
  See application file for complete search history.

(56) References Cited

U.S. PATENT DOCUMENTS

| | | | | |
|---|---|---|---|---|
| 6,417,738 B1* | 7/2002 | Lautzenhiser | .......... | H03L 7/189 327/156 |
| 6,771,133 B2* | 8/2004 | Lautzenhiser | .......... | H03L 7/189 327/156 |
| 2003/0001637 A1* | 1/2003 | Jung | ...................... | H03L 7/0805 327/158 |
| 2003/0012321 A1* | 1/2003 | Tokutome | ................ | G11C 7/22 375/376 |
| 2003/0200518 A1* | 10/2003 | Saeki | ........................ | G06F 1/06 327/149 |
| 2003/0201812 A1* | 10/2003 | Suzuki | .................. | H03L 7/0812 327/261 |
| 2007/0188206 A1* | 8/2007 | Lee | ........................... | H03L 7/07 327/158 |
| 2012/0154001 A1* | 6/2012 | Seo | ....................... | H03L 7/0814 327/158 |
| 2014/0203854 A1* | 7/2014 | Jung | ..................... | H03L 7/0802 327/158 |

(Continued)

*Primary Examiner* — Adam D Houston
(74) *Attorney, Agent, or Firm* — Crowe & Dunlevy

(57) ABSTRACT

A delay locked loop includes a control loop receiving reference and feedback clock signals, and generating biasing voltages therefrom. A delay chain receives the reference clock signal and generates N successively delayed versions thereof, each at a successive tap thereof. The Nth delayed version is the feedback clock signal. The control loop has a phase detector asserting an up signal when a phase of the feedback clock signal lags that of the reference clock signal, asserting a down signal when the phase of the feedback clock signal leads that of the reference clock signal. A digital filtering block compares a number of assertions of the up signal during the period of the reference clock signal to those of the down signal, and asserts an up or down command signal based thereupon. A biasing voltage generation circuit receives the up and down command signals and generates the biasing voltages therefrom.

17 Claims, 8 Drawing Sheets

(56) References Cited

U.S. PATENT DOCUMENTS

2015/0097604 A1* 4/2015 Taniguchi ............... H03L 7/085
327/158
2016/0173109 A1* 6/2016 Montoriol ............... H03L 7/085
327/156

* cited by examiner

SUB-CLOCK CURRENT PULSE GENERATOR

TECHNICAL FIELD

This application is directed to the field of pulse generation, and in particular, to the generation of a pulse having a fraction of a width of a reference clock pulse.

BACKGROUND

Augmented reality is a technology whereby live direct or indirect views of the physical real world are augmented with superimposed computer-generated images. For example, augmented reality technology may be incorporated into a headset worn by a user so that the computer-generated images are superimposed over the user's view of the real world. The computer-generated images may be information about the real world (e.g., the name of a landmark), information relative to the user's own life (e.g., a reminder of an upcoming appointment), etc.

Some augmented reality headsets involve the use of picoprojectors that scan RGB lasers across separate screens for each eye in scan patterns at a rate sufficient to form viewable images. Precise control of laser power and pulse width is of concern for this type of augmented reality headset to ensure proper functionality and that images appear as intended.

Other augmented reality headsets involve the use of picoprojectors that scan RGB lasers across each eye in scan patterns at a rate sufficient such that the eyes perceive images. Precise control of laser power and pulse width is of particular concern for this type of augmented reality headset in order to avoid causing discomfort to the user's eyes.

While techniques for precisely controlling laser power exist, there remains a need for techniques for precisely controlling laser pulse width. As such, there has been a need for further development in this area.

SUMMARY

A delay locked loop disclosed herein includes a control loop configured to receive a reference clock signal and a feedback clock signal, and to generate first and second biasing voltages based thereupon. The delay locked loop also includes a delay chain configured to receive the reference clock signal, and to generate N successively delayed versions of the reference clock signal, each at a successive tap of the delay chain. The delay locked loop also includes a pulse decoder configured to generate a pulsed output signal having a pulse width equal to a desired fraction of a pulse width of the reference clock signal by selecting taps (for example, two taps) of the delay chain for use as input. The delay chain has N delay cells.

Each nth delay cell of the N delay cells has, with n being an integer between 1 and N: a delay block configured to receive an (n−1)th delay output signal and to generate an nth delayed signal equal to the reference clock signal delayed by n/N of the reference clock signal minus an additional delay, but if (n−1) is equal to zero, the delay block is instead configured to receive the reference clock signal; and a dummy block with a circuit configured to receive the nth delayed signal and to output the nth delayed signal at an nth tap of the delay chain, and a dummy logic configured to receive the nth delayed signal from the circuit and add the additional delay thereto, the additional delay being a function of a delay time in the pulse decoder, the dummy logic also configured to generate an nth delay output signal equal to the nth delayed signal as delayed by the additional delay. The feedback clock signal is the Nth delay output signal.

The pulse decoder may also be configured to receive an input integer m, and the desired fraction may be m/N.

The circuit configured to receive the nth delayed signal, and output the nth delayed signal at an nth tap of the delay chain, may be a buffer circuit configured to receive the nth delayed signal, buffer the nth delayed signal, and output the nth delayed signal at an nth tap of the delay chain.

The delay block of each nth delay cell may include a first current source transistor configured to be biased by the first biasing voltage and configured to generate a first bias current, and a second current source transistor configured to be biased by the second biasing voltage and configured to generate a second bias current. The delay block of each nth delay cell may also include an inverter having an inverter PMOS transistor having a source coupled to the first current source transistor to receive the first bias current and a gate configured to receive the (n−1)th delay output signal, and having an inverter NMOS transistor having a drain coupled to a drain of the inverter PMOS transistor, a source coupled to the second current source transistor to receive the second bias current, and a gate configured to receive the (n−1)th delay output signal. This inverter may be configured to generate the nth delayed signal at the drains of the inverter PMOS transistor and inverter NMOS transistor. The delay block of each nth delay cell may also include psuedo-inverter having a psuedo-inverter PMOS transistor including a source coupled to the first current source transistor to receive the first bias current, a drain coupled to ground, and a gate configured to receive a complement of the (n−1)th delay output signal. The delay block of each nth delay cell may also include a psuedo-inverter NMOS transistor having a drain coupled to a supply voltage, a source coupled to the second current source transistor to receive the second bias current, and a gate configured to receive the complement of the (n−1)th delay output signal.

Another aspect disclosed herein is a delay locked loop including a control loop configured to receive a reference clock signal and a feedback clock signal, and to generate a first biasing voltage based thereupon, a delay chain configured to receive the reference clock signal, and to generate N successively delayed versions of the reference clock signal, each at a successive tap of the delay chain, and a pulse decoder configured to generate a pulsed output signal having a pulse width equal to a desired fraction of a pulse width of the reference clock signal by selecting taps (for example, two taps) of the delay chain for use as input. The delay chain includes N delay cells.

Each nth delay cell of the N delay cells includes, with n being an integer between 1 and N: a delay circuit biased by the first biasing voltage and configured to receive an (n−1)th delay output signal and generate an nth delayed signal equal to the reference clock signal delayed by n/N of the reference clock signal minus an additional delay, but if (n−1) is equal to zero, the delay circuit is instead configured to receive the reference clock signal, the delay circuit also configured to output the nth delayed signal at an nth tap of the delay chain, and add the additional delay to the nth delayed signal, the additional delay being a function of a delay time in the pulse decoder. The delay circuit is also configured to generate an nth delay output equal to the nth delayed signal as delayed by the additional delay. The feedback clock signal is the Nth delay output signal.

The delay circuit of each nth delay cell may include a first current source transistor configured to be biased by the first biasing voltage and configured to generate a first bias current, a second current source transistor configured to be biased by the first biasing voltage and configured to generate a second bias current, and a first inverter. The first inverter may include a first inverter PMOS transistor with a source coupled to a supply voltage and a gate configured to receive the (n−1)th delay output signal, and a first inverter NMOS transistor having a drain coupled to a drain of the first inverter PMOS transistor, a source coupled to the first current source transistor to receive the first bias current, and a gate configured to receive the (n−1)th delay output signal. The first inverter is configured to generate a first decaying ramped signal in response to assertion of the (n−1)th delay output signal. The delay circuit of each nth delay cell may also include a second inverter. The second inverter may include a second inverter PMOS transistor with a source coupled to the supply voltage and a gate configured to receive a complement of the (n−1)th delay output signal, and a second inverter NMOS transistor having a drain coupled to a drain of the first inverter PMOS transistor, a source coupled to the second current source transistor to receive the second bias current, and a gate configured to receive the complement of the (n−1)th delay output signal. The second inverter may be configured to generate a second decaying ramped signal in response to assertion of complement of the (n−1)th delay output signal. The delay circuit of each nth delay cell may also include circuitry configured to begin generation of a rising edge of the nth delay output signal when the first decaying ramped signal falls below a threshold voltage, and to begin generation of a falling edge of the nth delay output signal when the second decaying ramped signal falls below the threshold voltage.

The first and second bias currents may be equal, and may have a magnitude such that, when the (n−1)th delay output signal is asserted, the first inverter generates the first decaying ramped signal but the second inverter generates a first rising edge, and when the (n−t)th delay output signal is deasserted, the second inverter generates the second decaying ramped signal but the first inverter generates a second rising edge, a magnitude of a slope of the first decaying ramped signal being less than a magnitude of a slope of the first rising edge, a magnitude of a slope of the second decaying ramped signal being less than a magnitude of a slope of the second rising edge.

The circuitry may include a first set PMOS transistor having a source coupled to the supply voltage, a gate coupled to the drain of the first inverter PMOS transistor and the drain of the first inverter NMOS transistor, and a drain coupled to a first common node. The circuitry may also include a first reset NMOS transistor having a drain coupled to a second common node, a gate coupled to the drain of the first inverter PMOS transistor and the drain of the first inverter NMOS transistor through an inverter, and a source coupled to ground. The circuitry may also include a second set PMOS transistor having a source coupled to the supply voltage, a gate coupled to the drain of the second inverter PMOS transistor and the drain of the second inverter NMOS transistor, and a drain coupled to the second common node. The circuitry may further include a second reset NMOS transistor having a source coupled to the first common node, a gate coupled to the drain of the second inverter PMOS transistor and the drain of the second inverter NMOS transistor through an inverter, and a source coupled to ground. The nth delay output signal may be generated at the first common node, a complement of the nth delay output signal may be generated at the second common node, and a SR latch may have a set input coupled to the first common node and a reset input coupled to the second common node.

The delay circuit of each nth delay cell may also include an OR gate having a first input coupled to the drain of the first inverter PMOS transistor and the drain of the first inverter NMOS transistor, a second input coupled to a select signal through an inverter, a third input coupled to the first common node, and an output. The delay circuit of each nth delay cell may also include a PMOS transistor having a source coupled to the supply voltage, a gate coupled to the output of the OR gate, and a drain at which the nth delayed signal is generated. The delay circuit of each nth delay cell may further include an NMOS transistor having a source coupled to ground, a gate coupled to the output of the OR gate through an inverter, and a drain at which a complement of the nth delayed signal is generated.

The pulsed output signal may be produced to have a pulse width equal to a desired fraction of a pulse width of the reference clock signal by generating a rising edge and a falling edge. Each of the N delay cells may be either used to produce the rising edge or to produce the falling edge, with a total number of the N delay cells used to produce the rising edge indicating a delay between start of the period of the reference clock signal and the rising edge, and with a total number of the N delay cells used to produce the falling edge indicating a delay between the falling edge and end of the period of the reference clock signal. In addition, the pulse decoder may include a circuit configured to select a first series of taps representing the delayed signals respectively produced by each of the N delay cells used to produce the rising edge of the pulsed output signal, select a second series of taps representing complements of the delayed signals respectively produced by each of the N delay cells used to produce the rising edge of the pulsed output signal, select a third series of taps representing the delayed signals respectively produced by each of the N delay cells used to produce the falling edge of the pulsed output signal, and select a fourth series of taps representing complements of the delayed signals respectively produced by each of the N delay cells used to produce the falling edge of the pulsed output signal. The pulse decoder may also include a SR latch having a set input coupled to the first series of taps and the fourth series of taps, a reset input coupled to the second series of taps and the third series of taps, and an output producing the pulsed output signal through a buffer.

A delay cell of the N delay cells associated with a last of the first series of taps may receive an asserted version of the select signal, and a delay cell of the N delay cells associated with a first of the third series of taps may receive receive an asserted version of the select signal. Remaining ones of the N delay cells may receive a deasserted version of the select signal.

The control loop may include a phase detector configured to receive the reference clock signal and the feedback clock signal, to assert an up signal in response to a phase of the feedback clock signal lagging a phase of the reference clock signal, and to assert a down signal in response to the phase of the feedback clock signal leading the phase of the reference clock signal. The control loop may also include a digital filtering block configured to receive the up and down signals, to count a number of assertions of the up signal during a plurality of periods of the reference clock signal, to count a number of assertions of the down signal during the plurality of periods of the reference clock signal, to compare the number of assertions of the up signal during the plurality of periods of the reference clock signal to the number of assertions of the down signal during the plurality of periods of the reference clock signal, and to then assert an up command signal or a down command signal based upon the comparison. The control loop may also include a biasing voltage generation circuit configured to receive the up command signal and down command signal, and to generate the first biasing voltage based thereupon.

The control loop may include a phase detector configured to receive the reference clock signal and the feedback clock signal, to assert an up signal in response to a phase of the feedback clock signal lagging a phase of the reference clock signal, and to assert a down signal in response to the phase of the feedback clock signal leading the phase of the reference clock signal. The control loop may also include a digital filtering block configured to receive the up and down signals, to count a number of assertions of the up signal during a plurality of periods of the reference clock signal, to count a number of assertions of the down signal during the plurality of periods of the reference clock signal, to compare the number of assertions of the up signal during the plurality of periods of the reference clock signal to the number of assertions of the down signal during the plurality of periods of the reference clock signal, and to then assert an up command signal or a down command signal based upon the comparison. The digital filtering block may be further configured to assert a trigger signal substantially simultaneously with asserting the up command signal or the down command signal.

The control loop may also include a monostable configured to receive the trigger signal, and to assert its output in a pulse based upon receipt of the trigger signal. A first AND gate may be configured to receive the up command signal and the output of the monostable, and to generate a first switch control signal as a result of a logical AND operation therebetween. A second AND gate is configured to receive the down command signal and the output of the monostable, and to generate a second switch control signal as a result of a logical AND operation therebetween.

An integration capacitor may be coupled between a node and ground. A first switch may be configured to selectively couple the integration capacitor to a current source in response to assertion of the first switch control signal. A second switch may be configured to selectively couple the integration capacitor to a current sink in response to assertion of the second switch control signal. An operational transconductance amplifier may have an inverting terminal coupled to the node, a non-inverting terminal coupled to a second node, and an output. A resistor may be coupled between the second node and ground. A first PMOS transistor may have a source coupled to a supply voltage, a drain coupled to the second node, and a gate coupled to the output of the operational transconductance amplifier. A second PMOS transistor may have a source coupled to the supply voltage, a drain coupled to a diode coupled NMOS transistor to produce the first biasing voltage, and a gate coupled to the output of the operational transconductance amplifier.

The digital filtering block may be further configured to generate a current source control signal for the current source based upon the comparison of the number of assertions of the up signal during the plurality of periods of the reference clock signal to the number of assertions of the down signal during the plurality of periods of the reference clock signal, and to generate a current sink control signal for the current sink based upon the comparison of the number of assertions of the up signal during the plurality of periods of the reference clock signal to the number of assertions of the down signal during the plurality of periods of the reference clock signal.

Another aspect disclosed herein is a delay locked loop including a control loop configured to receive a reference clock signal and a feedback clock signal, and to generate at least one biasing voltage based thereupon. The delay locked loop also includes a delay chain configured to receive the reference clock signal, and to generate N successively delayed versions of the reference clock signal, each at a successive tap of the delay chain, wherein the Nth delayed version of the reference clock signal is the feedback clock signal. The control loop also includes a phase detector configured to receive the reference clock signal and the feedback clock signal, to assert an up signal in response to a phase of the feedback clock signal lagging a phase of the reference clock signal, and to assert a down signal in response to the phase of the feedback clock signal leading the phase of the reference clock signal. The control loop also includes a digital filtering block configured to receive the up and down signals, to count a number of assertions of the up signal during a plurality of periods of the reference clock signal, to count a number of assertions of the down signal during the plurality of periods of the reference clock signal, to compare the number of assertions of the up signal during the plurality of periods of the reference clock signal to the number of assertions of the down signal during the plurality of periods of the reference clock signal, and to then assert an up command signal or a down command signal based upon the comparison. The control loop also includes a biasing voltage generation circuit configured to receive the up command signal and down command signal, and to generate the at least one biasing voltage based thereupon.

The digital filtering block may be further configured to assert a trigger signal substantially simultaneously with asserting the up command signal or the down command signal.

The biasing voltage generation circuit may include a monostable configured to receive the trigger signal, and to assert its output in a pulse based upon receipt of the trigger signal. The biasing voltage generation circuit may also include a first AND gate configured to receive the up command signal and the output of the monostable, and to generate a first switch control signal as a result of a logical AND operation therebetween. The biasing voltage generation circuit may also include a second AND gate configured to receive the down command signal and the output of the monostable, and to generate a second switch control signal as a result of a logical AND operation therebetween.

The biasing voltage generation circuit may also include an integration capacitor coupled between a node and ground, a current source, a first switch configured to selectively couple the integration capacitor to the current source in response to assertion of the first switch control signal, a current sink, a second switch configured to selectively couple the integration capacitor to the current sink in response to assertion of the second switch control signal, and an operational transconductance amplifier having an inverting terminal coupled to the node, a non-inverting terminal coupled to a second node, and an output. The biasing voltage generation circuit may also include a resistor coupled between the second node and ground, and a first PMOS transistor having a source coupled to a supply voltage, a drain coupled to the second node, and a gate coupled to the output of the operational transconductance amplifier. The biasing voltage generation circuit may also include a second PMOS transistor having a source coupled to the supply voltage, a drain coupled to a diode coupled NMOS transistor to produce the at least one biasing voltage, and a gate coupled to the output of the operational transconductance amplifier.

The digital filtering block may be further configured to generate a current source control signal for the current source based upon the comparison of the number of assertions of the up signal during the plurality of periods of the reference clock signal to the number of assertions of the down signal during the plurality of periods of the reference clock signal, and to generate a current sink control signal for the current sink based upon the comparison of the number of assertions of the up signal during the plurality of periods of the reference clock signal to the number of assertions of the down signal during the plurality of periods of the reference clock signal.

DETAILED DESCRIPTION

The following disclosure enables a person skilled in the art to make and use the subject matter disclosed herein. The general principles described herein may be applied to embodiments and applications other than those detailed above without departing from the spirit and scope of this disclosure. This disclosure is not intended to be limited to the embodiments shown, but is to be accorded the widest scope consistent with the principles and features disclosed or suggested herein.

Figure 1A:
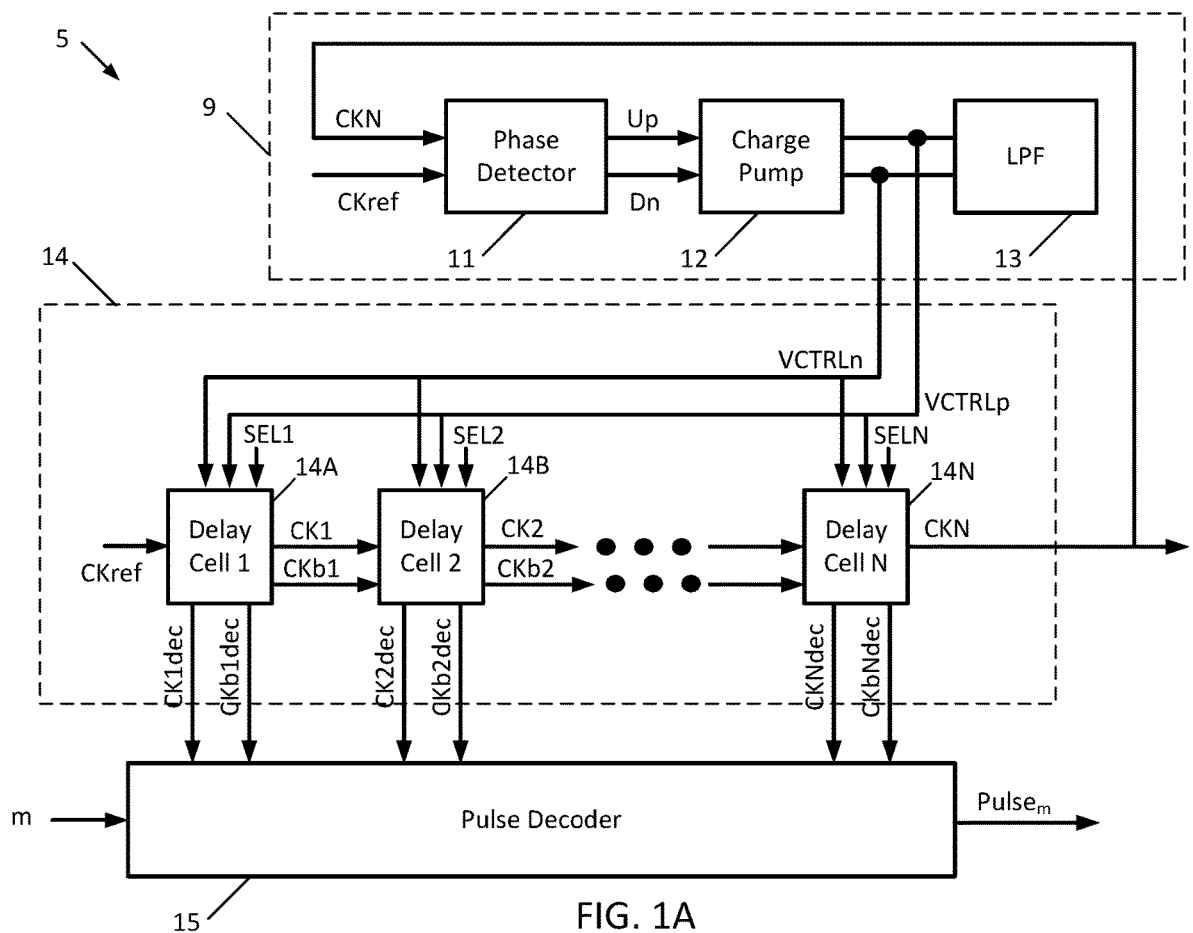
FIG. 1A is a block diagram of a first embodiment of a circuit for generating a pulsed signal that has a pulse width equal to a desired fraction of a pulse width of a reference clock signal.

With initial reference to FIG. 1A, now described is a delay locked loop (DLL) 5 that includes a control loop 9, delay chain 14, and pulse decoder 15. For ease of understanding, first the delay chain 14 will be described in general; later, specific implementation details and specific operation details will be given.

The delay chain 14 is comprised of N delay cells 14A . . . 14N, with N being any integer. The first delay cell 14A receives as input a reference clock CKref, is controlled by control signals VCTRLn and VCTRLp, and outputs a delayed version CK1 of the reference clock CKref together with its complement CKb1 suitable for use in generating a final delayed version CKN of the reference clock CKref (representing a delay of one period compared to CKref) for use by the control loop 9 in locking the delay provided by the delay chain 14.

Each remaining delay cell 14B . . . 14N receives as input the outputs of the immediately preceding delay cell, and is likewise controlled by control signals VCTRLn and VCTRLp. Each remaining delay cell 14B . . . 14N therefore outputs a respective increasingly delayed version of the reference clock CKref CK1 and CKb1 are delayed from CKref by 1/N of the period of CKref, while CK2 and CKb2 are delayed from CKref by 2/N of the period of CKref, and so on and so forth until CKN is delayed from CKref by an entire period of CKref.

Figure 1B:
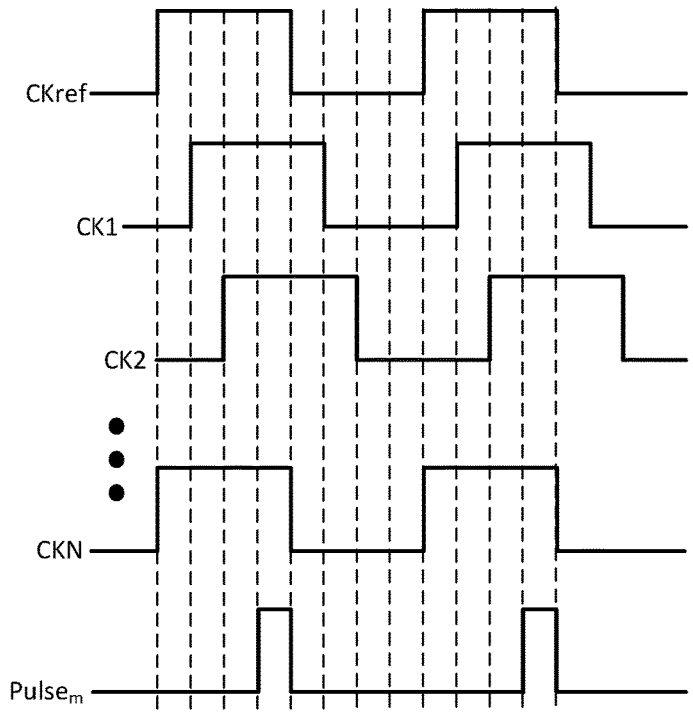
FIG. 1B is a graph showing the reference clock (CKref), and the delayed versions (CK1 . . . CKN) of the reference clock produced by the delay locked loop of FIG. 1A.

The N delayed versions of the reference clock CKref produced by the delay chain 14 are illustrated in FIG. 1B, showing the reference clock CKref, and the N delayed versions CK1 . . . CKN of the reference clock produced by the delay chain 14. N defines the number of sub-steps into which the DLL 5 divides the whole period of the reference clock CKref. For this example, N is 8, and as can be seen, the whole period of the reference clock CKref is divided into 8 sub-steps. It can therefore be seen that CK1 is delayed by ⅛ of the period of the reference clock CKref, CK2 is delayed by ⅔ of the period of the reference clock CKref, and so on, until CKN (which here would be CK8) is delayed by a full period of CKref.

The control loop 9 receives the reference clock CKref together with CKN and generates the control signals VCTRLn and VCTRLp in such a fashion to keep phase alignment between CKref and CKN (also shown in FIG. 1B, where CKref and CKN are in phase alignment). In greater detail, the control loop 9 includes a phase detector 11 receiving CKN and the reference clock CKref, which generates control signals Up/Dn for a charge pump 12 that generates the control signals VCTRLn and VCTRLp so as to keep the phases of CKN and CKref aligned. A loop filter 13 for the control loop 9 is a low-pass filter as shown (and may be, for example, a capacitor coupled between the output of the charge pump 12 and ground), but other filtering techniques can be used.

The function and purpose of the pulse decoder 15 will be explained below, however, in general, the pulse decoder produces a pulsed output signal $Pulse_m$ having a pulse width of m/N of the pulse width of the reference clock CKref and a fixed position within the period of the reference clock CKref (such as occurring during the fourth sub-step of the period of the reference clock CKref), with m being an input to the pulse decoder 15. It is to be noted that an issue introduced by the pulse decoder 15 is that it introduces its own delay, meaning that the pulses of $Pulse_m$ would not occur during the desired portion of the pulses of CKref. Since this would be undesirable, the delay chain 14 has been designed to compensate for the delay introduced by the pulse decoder 15.

Therefore, the first delay cell 14A also outputs a version CK1*dec* of CK1 together with its complement CKb1*dec* suitable for use by the pulse decoder 15 in generating the pulsed output signal $Pulse_m$. CK1*dec* and CKb1*dec*, as compared to CK1 and CK1*b*, lack the additional delay expected in the pulse decoder 15 at that tap location. Therefore CK1 and CKb1 are delayed from CKref by 1/N of the period of CKref, while CK1*dec* and CKb1*dec* are delayed from CKref by 1/N of the period of CKref minus the additional delay expected in the pulse decoder 15.

Each remaining delay cell 14B . . . 14N also outputs versions of its delay signals for use by the pulse decoder 15—delay cell 14B outputs a version CK2*dec* (together with its complement CKb2*dec*) of CK2, and so on and so forth until delay cell 14N outputs a version CKNdec (together with its complement CKbNdec) of CKN. Here, CK2*dec* and CKb2*dec* are delayed from CKref by 2/N of the period of CKref minus the additional delay expected in the pulse decoder 15, and so on and so forth until CKNdec and CKbNdec are delayed from CKref by an entire period of CKref minus the additional delay expected in the pulse decoder 15.

The pulse decoder 15 receives the delayed versions CK1*dec* . . . CKNdec of the reference clock CKref from the delay chain 14 as input (in addition to their complements), as well as an input code m. Through the use of CK1*dec* . . . CKNdec and CKb1*dec* . . . CKbNdec by the pulse decoder 15 instead of CK1 . . . CKN, the pulse decoder 15 produces a pulsed output signal Pulse$_m$ properly having a pulse width of m/N and a fixed position within the period of the reference clock CKref. Therefore, through the selection of the value of m, the pulse width of the pulsed output signal Pulse$_m$ and its position within the period of the reference clock CKref are selected. The output Pulse$_m$ can be used, for example, for input to a laser driver used in a picoprojector, although other uses can be envisaged.

Typically in a laser driver, in each period of CKref, a current (properly modulated in amplitude), is output. Nevertheless, it is commonly desired by designers to output this current for less than the entire period of CKref, such as for a fraction N of the entire period of CKref. This helps, as will be understood by those of skill in the art, to provide brightness control and also to reduce the so-called speckle noise. However, the position of Pulse$_m$ inside the period of CKref must be well defined and fixed. The pulse decoder is outside the loop of the DLL, so in prior art designs, the error (for instance the delay) introduced by the pulse decoder is not well controlled. However, using the DLL 5 disclosed herein allows this delay to be canceled out (at a first order), leading to a better definition of the Pulse$_m$ position into the period of CKref.

To accomplish this functionality, the pulse decoder 15 (depending on the value of m) combines outputs or "taps" (for example, two taps) of the delay chain 14 to produce Pulse$_m$ as having the desired rising edge and desired falling edge.

To compensate for the delay in the pulse decoder 15, as explained, the delayed versions CK1*dec* . . . CKNdec and CKb1*dec* . . . CKbNdec of the reference clock used by the pulse decoder 15 (as compared to the delayed versions CK1 . . . CKN and CKb1 . . . CKbN of the reference clock CKref) have had the delay expected in the pulse decoder 15 removed therefrom. This "expected" delay in the pulse decoder 15 is intended to emulate the delay that would be experienced in the dummy path with the current tap selection resulting from the current value of m. In the example shown in FIG. 1B, m is, for example, 1, and N is, for example, 8, resulting in Pulse$_m$ having a pulse width of ⅛ of the period of CKref, as shown.

To state the above describe operations another way, if DLL 5 is properly locked and the delay cells 14A . . . 14N are matched, the aim of the control loop 9 is to have the edges of CKref and CKN be coincident. As a consequence, each delay cell 14A . . . 14N will take exactly 1/N of the whole CKref period, so the output of each delay cell 14A . . . 14N is representative of the timing point located at n/N [n=1, 2, . . . N] of the period of CKref. Using the taps of the delay cells 14A . . . 14N that are combined to produce Pulse$_m$, the delay introduced by the pulse decoder 15 will shift the effective edges with respect to their exact n/N position. Taking the taps for the decoder before the dummy cell introduces more or less the same delay as the pulse decoder path allows compensating for this delay, thereby re-aligning the Pulse$_m$ edges to the n/N timing position.

Figure 2:
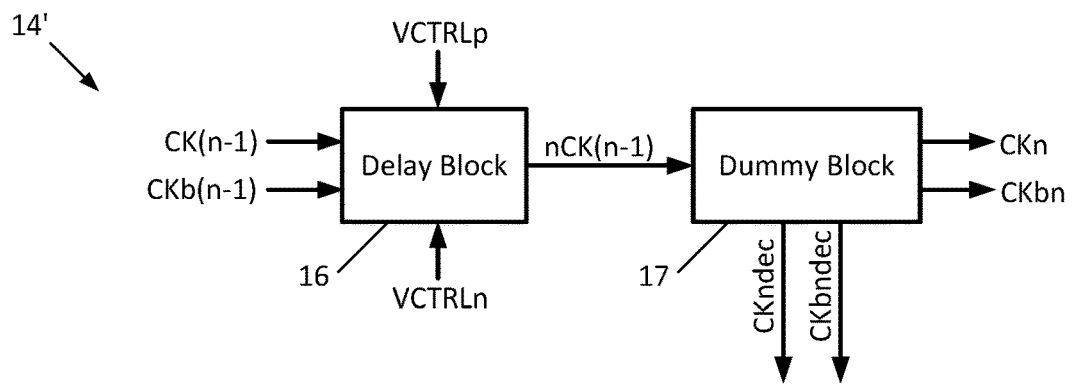
FIG. 2 is a block diagram of the delay cells of FIG. 1A.

Shown in FIG. 2 is a block diagram of a single delay cell 14' for purposes of understanding the structure of the delay cells 14A . . . 14N. The delay cell 14' includes a delay block 16 and dummy block 17.

The delay block 16 is controlled by the control signals VCTRLp and VCTRLn, and receives as input the delay version of the reference clock CKref and its complement as produced by the preceding delay cell in the delay chain 14—here, these are indicated as CK(n−1) and CKb(n−1) (with n being any positive integer up to N). Note that if the delay cell 14' were the first delay cell in the delay chain 14, the delay block 16 would receive CKref as input instead of CK(n−1) and CKb(n−1). The delay block 16 produces as output an intermediate signal noted as nCK(n−1).

The dummy block 17 receives the intermediate signal nCK(n−1) as input, delays it by an amount intended to emulate the delay in the pulse decoder 15, and produces from it the delayed version CKn of the clock signal CKref, together with its complement CKbn. The dummy block 17 also produces the versions CKndec and CKbndec of CKn and CKbn for use by the pulse decoder 15.

Figure 3:
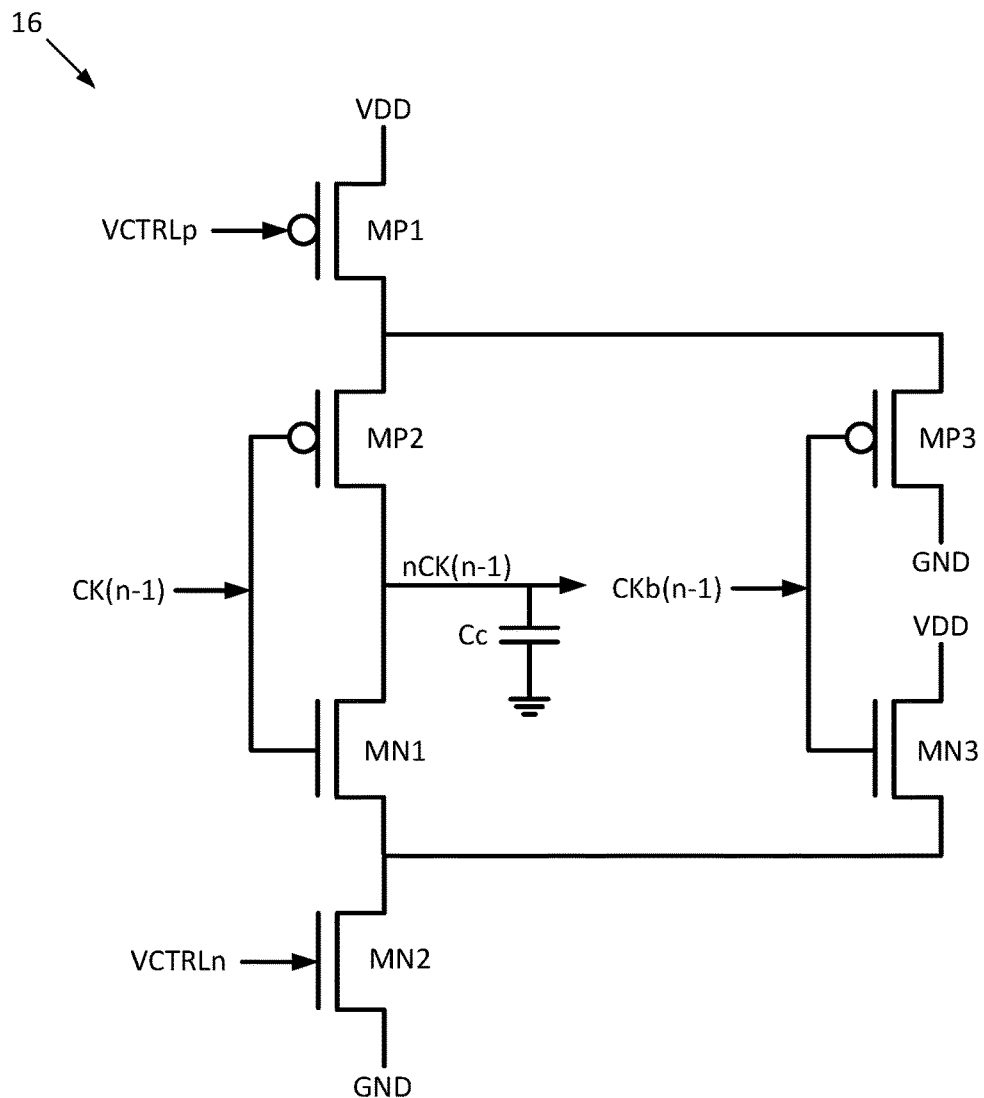
FIG. 3 is a schematic diagram of the delay block of FIG. 2.

Details of the delay block 16 are shown in FIG. 3. The delay block 16 includes a CMOS inverter arrangement produced by a series connection of PMOS transistor MP2 and NMOS transistor MN1 (which receives CK(n−1) as input and produces nCK(n−1) as output), with the source of PMOS transistor MP2 being biased by a current sourced from supply VDD by PMOS transistor MP1, and with the source of NMOS transistor MN1 being biased by a current sunk to ground by NMOS transistor MN2. PMOS transistor MP1 is controlled by the VCTRLp signal produced by the charge pump 12 of the control loop 9 (in that VCTRLp controls the magnitude of the source current produced by MP1), and NMOS transistor MN2 is biased by the VCTRLn signal produced by the charge pump 12 of the control loop 9 (in that VCTRLn controls the magnitude of the sink current produced by MN2). A delay capacitor Cc is coupled between the drain of MP2/drain of MN1 and ground. The purpose of the PMOS transistor MP1 and the NMOS transistor MN2 is to provide a steady current to the CMOS inverter arrangement, without turning off, allowing the avoidance of issues that would be present if these transistors switched. Therefore, understand that while the control loop 9 adjusts VCTRLp and VCTRLn, it does not reduce them such that the PMOS transistor MP1 and NMOS transistor MN2 fall out of saturation and switch off. Instead, any adjustment is to alter the rise and/or fall slopes of the outputs nCK(n−1).

To understand the operation of the delay block 16 of FIG. 3, consider that FIG. 3 (neglecting PMOS transistor MP3 and NMOS transistor MN3, which will be described below) shows a delay cell in which PMOS transistor MP1 and NMOS transistor MN2 are (equal) current generators always biased to be on by the signals VCTRLp and VCTRLn. Those voltages are modulated by the control loop 9 in order to adjust delay of the delay cell.

When CK(n−1) goes high, NMOS transistor MN1 is turned on and the current through the NMOS transistor MN2 discharges the output capacitance (which includes the capacitor Cc). The time needed for this current to discharge nCK(n−1) below the threshold voltage of the following gate (not shown in figure) defines the delay on CK(n−1) rising edge.

Similarly, when CK(n−1) falls low, PMOS transistor MP2 is turned on and NMOS transistor MN1 turns off, and the current through the PMOS transistor MP1 charges the output capacitance (which includes the capacitor Cc).

Therefore, while NMOS transistor MN2 and PMOS transistor MP1 are always on (their VGS is greater than their threshold voltages), they can source/sink current to the output only if NMOS transistor MN1 or PMOS transistor MP2 are respectively turned-on. The control loop 9 changing the VCTRLn, VCTRLp voltages will change the slope to charge and/or discharge the output capacitance (and therefore change the time to charge and/or discharge the output capacitance).

Conventionally (where the PMOS transistor MP3 and NMOS transistor MN3 are not present), PMOS transistor MP1 and NMOS transistor MN2 will have a drain to source voltage of zero for the time in which they are blocked by PMOS transistor MP2 or NMOS transistor MN1 respectively. When PMOS transistor MP2 or NMOS transistor MN1 becomes active, since they have at the beginning a drain to source voltage of zero, they are not able to immediately provide the proper current. Moreover, conventionally, PMOS transistor MP2 or NMOS transistor MN1 switching also adds a charge contribution to the output node. These two real world effects would therefore result in operating characteristics different than they would be if PMOS transistor MP1 and NMOS transistor MN2 acted as ideal (controlled) current generators.

To address these real world effects resulting from the lack of ideal behavior of PMOS transistor MP1 and the NMOS transistor MN2, PMOS transistor MP3 and NMOS transistor MN3 have been added.

The delay block 16 also includes a psuedo inverter formed from PMOS transistor MP3 and NMOS transistor MN3. Here, the source of PMOS transistor MP3 is connected to the drain of PMOS transistor MP1 and the source of PMOS transistor MP2, the drain of PMOS transistor MP3 is connected to ground, and the gate of PMOS transistor MP3 is biased by CKb(n−1). In addition, the drain of NMOS transistor MN3 is connected to VDD, the source of NMOS transistor MN3 is connected to the source of NMOS transistor MN1 and the drain of NMOS transistor MN2, and the gate of NMOS transistor MN3 is also biased by CKb(n−1), and is therefore tied to the gate of PMOS transistor MP3.

Consider the case in which the PMOS transistor MP2 is off. In that case, the PMOS transistor MP3 is on and it allows the PMOS transistor MP1 to keep sourcing current. In this period, nCK(n−1) is grounded by the NMOS transistor MN2. When CK(n−1) goes low, the PMOS transistor MP2 turns on and the PMOS transistor MP3 turns off. The PMOS transistor MP1 can therefore continue to source its current; its drain to source voltage is more or less unchanged. Moreover, PMOS transistors MP2 and MP3 (and NMOS transistors MN3 and MN1) will switch so that one is on while the other one is off, at the same time. Since they are designed to be the same size, the charge injections related to the switching cancel out one another (at first order).

Now consider the case where the NMOS transistor NM1 is off. In this case, the NMOS transistor MN3 is on and it allows the NMOS transistor MN2 to keep sinking current. In this period, nCK(n−1) is pulled high by PMOS transistor MP1. When CK(n−1) goes high, the NMOS transistor MN1 turns on and the NMOS transistor MN3 turns off. The NMOS transistor MN2 can therefore continue to sink current.

Figure 4:
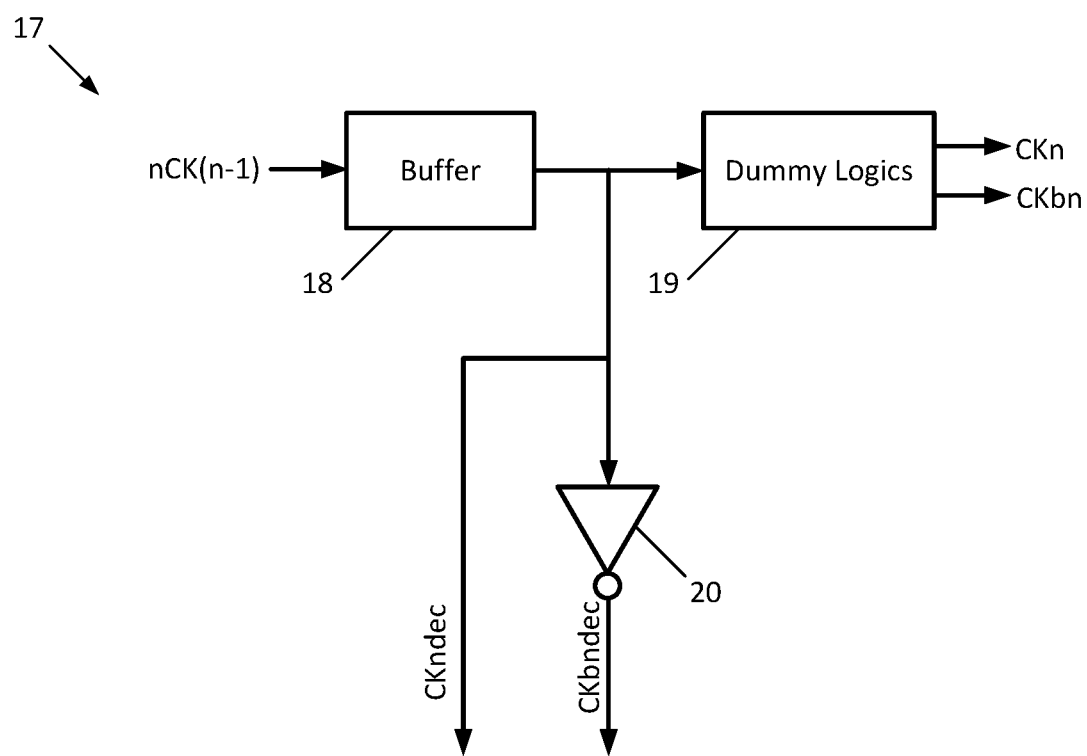
FIG. 4 is a block diagram of the dummy block of FIG. 2.

Details of the dummy block 17 are shown in FIG. 4. The dummy block 17 includes a buffer 18 receiving the intermediate signal nCK(n−1), and producing from it CKndec and CKbndec (through inverter 20) for use by the pulse decoder 15. Dummy logics 19 are intended to replicate the delay in the pulse decoder 15 with the current tap selection resulting from the current value of m. Since it is CKndec and CKbndec that are used by the pulse decoder 15 to produce Pulse$_m$, but it is CKN that is used by the control loop 9 of the DLL 5, CKndec and CKbndec are in effect pre-compensated for the delay that will be introduced by the pulse decoder 15 with the current tap selection resulting from the current value of m.

Therefore, this design of DLL 5 as utilizing the delay chain 14 has compensated for and addressed the issue of delay introduced by the pulse decoder 15.

Figure 5:
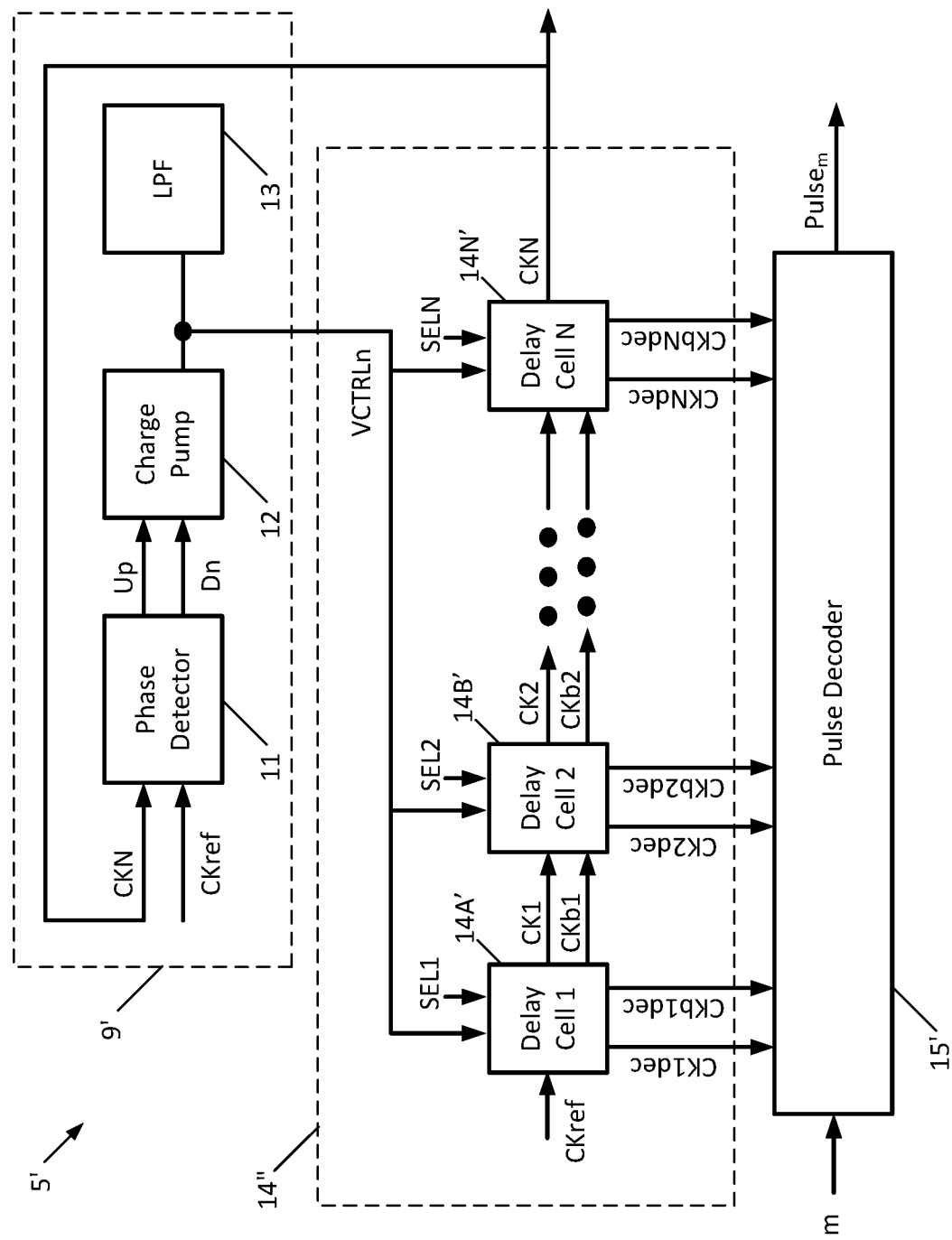
FIG. 5 is a block diagram of a second embodiment of a circuit for generating a pulsed signal that has a pulse width equal to a desired fraction of a pulse width of a reference clock signal.

Another embodiment of DLL 5' is now described with reference to FIG. 5. The delay locked loop (DLL) 5' includes a control loop 9', delay chain 14", and pulse decoder 15'. The general function of the control loop 9, delay chain 14", and pulse decoder 15' are the same as that of FIG. 1. However, the implementation details of the delay chain 14" and pulse decoder 15' are different.

Figure 6:
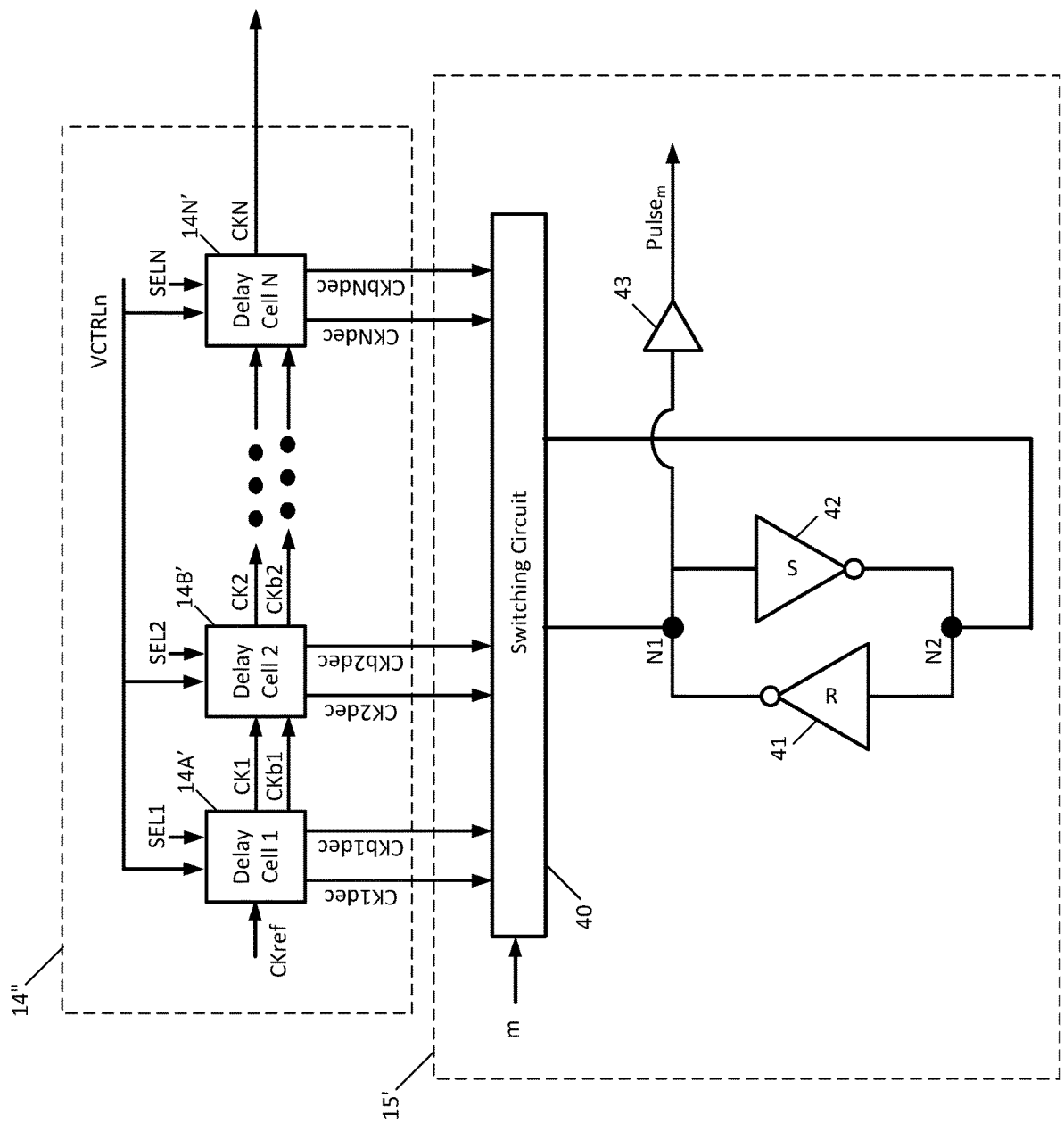
FIG. 6 is a schematic block diagram of the pulse decoder of FIG. 5, including a block diagram of the delay chain of FIG. 5 so that the connections between the components of the pulse decoder and delay chain can be seen.

The pulse decoder 15' is shown in detail in FIG. 6. The pulse decoder 15' includes a circuit 40 that receives the input m, and connects each tap of CK1*dec*, CKb1*dec* . . . CKN*dec*, CKbN*dec* to either node N1 or node N2 based on hardware definition. A SR latch formed from inverters 41 and 42 is coupled between nodes N1 and N2. In particular, the inverter 41 has its input coupled to node N2 and its output coupled to node N1, while the inverter 42 has its input coupled to node N1 and its output coupled to node N2. The node N1 is tapped for providing output Pulse$_m$ of the pulse decoder 15' through the buffer 43.

Figure 7:
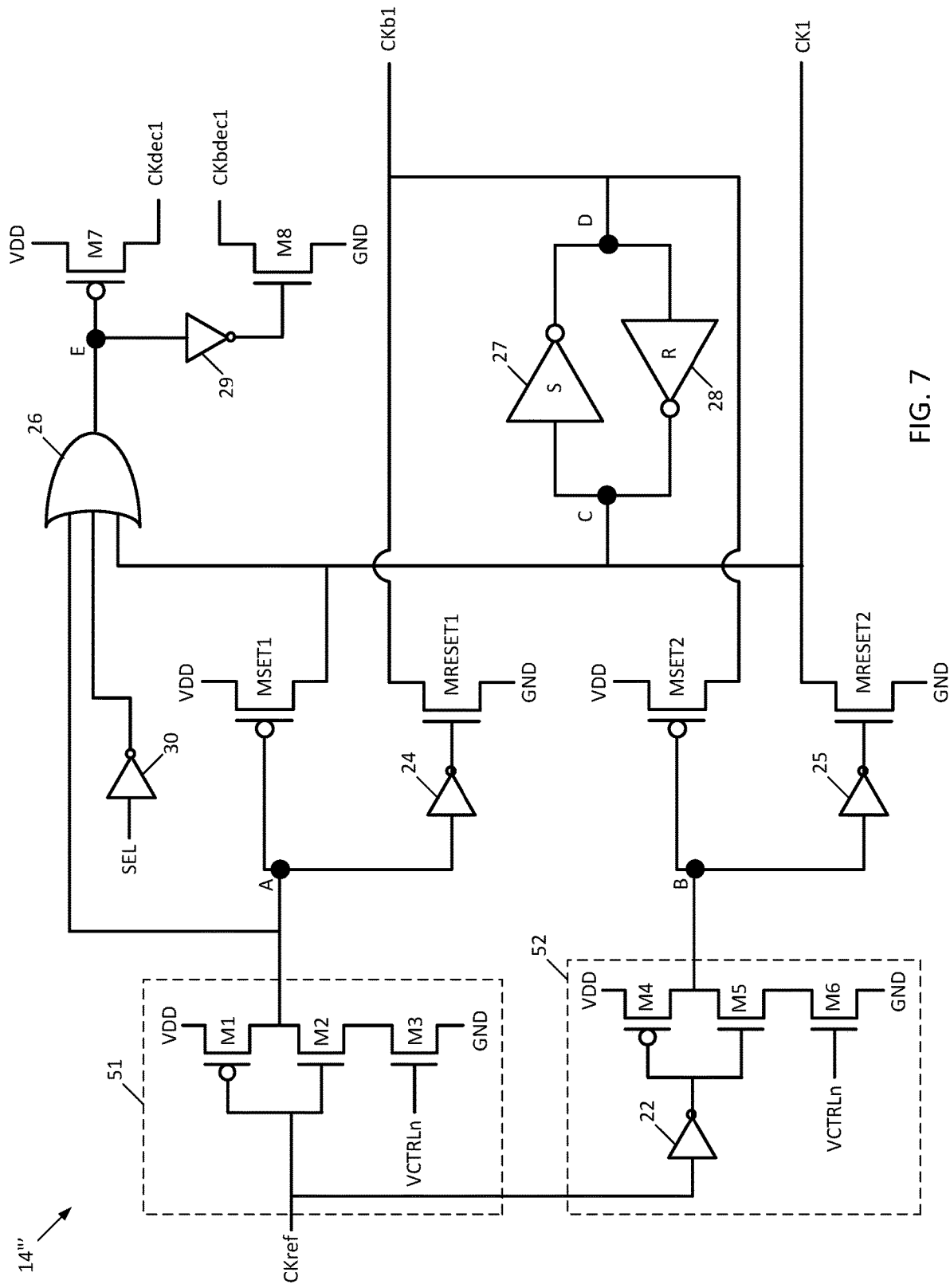
FIG. 7 is a schematic diagram of a sample delay cell of the delay cells of FIGS. 5-6.

Due to how the CK1*dec*, CKb1*dec* . . . CKN*dec*, CKbN*dec* signals are generated (shown in FIG. 7, and described in detail below), nodes N1 and N2 are for the main part of the period of CKref not forced by any delay cell of the delay chain 14" (because M7 and M8 of FIG. 7 are off except for a possible short pulse). The logical status of N1 and N2 is maintained by the SR latch formed by the inverters 41 and 42 in a hold mode once a specific delay cell of the delay chain 14" sets or resets them the SR latch. Selection of the taps to create the rise and fall time of the output pulse Pulse$_m$ is defined both by the way that respective ones of CK1*dec*, CKb1*dec* . . . CKN*dec*, CKbN*dec* of a given delay cell of the delay chain 14" are connected to N1 and N2, as well as the value of the signal SEL (e.g., SEL1 . . . SELN, which are based upon the value of m) for each delay cell of the delay chain 14" itself.

This operation is perhaps best understood with reference to a specific example. For this example, assume that the delay chain 14" and pulse decoder 15' of FIG. 6 are designed to generate an output pulse Pulse$_m$ with a rising edge that can appear at ⅛, ⅖, ⅜ or ⅘ of the period of CKref and a falling edge that can appear at ⅝, ⅝, ⅞ or ⅝ of the period of CKref.

Therefore, first, the first four delay cells (14A', 14B', 14C', and 14D') will have CK1*dec*, CK2*dec*, CK3*dec*, and CK4*dec* connected to N1 and CKb1*dec*, CKb2*dec*, CKb3*dec*, and CKb4*dec* connected to node N2; similarly, the last four delay cells (14E', 14F', 14G', and 14H', with 14H' here being 14N') will have CK5*dec*, CK6*dec*, CK7*dec*, and CK8*dec* connected to node N2 and CKb5*dec*, CKb6*dec*, CKb7*dec*, and CKb8*dec* connected to node N1.

Now, if for instance it is desired to generate a pulse of Pulse$_m$ with a pulse width equal to ⅘ (so, m=4, and N=8), with a rising edge at ⅖ of the period of CKref and a falling edge at ⅝ of Ckref, select (with SEL being high) the delay cells 14B' and 14F'. Therefore, understand that the delay cell which is to generate the rising edge is selected (with SEL being high), the delay cell which is to generate the falling edge is selected (with SEL being high), and SEL is low for the other delay cells.

This arrangement can be generalized, as will be understood by those of skill in the art, to have the pulse of Pulse$_m$ located anywhere desired inside the period of CKref.

Turning now to FIG. 7, a sample delay cell 14''' of the delay chain 14'' is shown, with it being noted that this example is of the first delay cell in the delay chain 14''. The delay cell 14''' includes a first CMOS inverter 51 formed from PMOS transistor M1 and NMOS transistor M2. In particular, the PMOS transistor M1 has its source coupled to the supply voltage VDD, its drain coupled to the drain of the NMOS transistor M2 at node A, and its gate coupled to the gate of the NMOS transistor M2 to receive the reference clock signal CKref. The NMOS transistor M2 has its drain coupled to the drain of the PMOS transistor M1, its source coupled to the drain of the NMOS transistor M3, and its gate coupled to the gate of the PMOS transistor M1 to receive the reference clock signal CKref. An NMOS transistor M3 has its drain coupled to the source of the NMOS transistor M2, its source coupled to ground, and its gate biased by the VCTRLn signal and acting as a low side current sink for the first CMOS inverter 51.

Here, note that the fact that the first CMOS inverter 51 is supplied on its high side directly by the power supply node VDD but on its low side by the NMOS transistor M3, so the rise of output of the first CMOS inverter 51 will be substantially a step, but the fall of the output of the first CMOS inverter 51 is tunable by the magnitude of VCTRLn. The control loop 9' of the DLL 5' therefore tunes the magnitude of VCTRLn such that the fall of the output of the first CMOS inverter 51 is a decay as opposed to a step down (this can be seen in the traces of A and B shown in FIG. 8, as will be described below).

The delay cell 14''' also includes a second CMOS inverter 52 formed from PMOS transistor M4 and NMOS transistor M5. In particular, the PMOS transistor M4 has its source coupled to the supply voltage VDD, its drain coupled to the drain of the NMOS transistor M5 at node B, and its gate coupled to the gate of the NMOS transistor M5 to receive the reference clock signal CKref through an inverter 22. The NMOS transistor M5 has its drain coupled to the drain of the PMOS transistor M4, its source coupled to the drain of the NMOS transistor M6, and its gate coupled to the gate of the PMOS transistor M4 to receive the reference clock signal CKref through an inverter. An NMOS transistor M6 has its drain coupled to the source of the NMOS transistor M5, its source coupled to ground, and its gate biased by the VCTRLn signal and acting as a low side current sink for the second CMOS inverter 52.

Here, note that the fact that the second CMOS inverter 52 is supplied on its high side directly by the power supply node VDD but on its low side by the NMOS transistor M6, so the rise of output of the second CMOS inverter 52 will be substantially a step, but the fall of the output of the second CMOS inverter 52 is tunable by the magnitude of VCTRLn. The control loop 9' of the DLL 5' therefore tunes the magnitude of VCTRLn such that the fall of the output of the second CMOS inverter 52 is a decay as opposed to a step down (this can be seen in the traces of A and B shown in FIG. 8, as will be described below).

A PMOS transistor MSET1 has its source coupled to the supply voltage VDD, its drain coupled to node C, and its gate coupled to node A. An NMOS transistor MRESET1 has its source coupled to ground, its drain coupled to node D, and its gate coupled to node A through the inverter 24. A PMOS transistor MSET2 has its source coupled to the supply voltage VDD, its drain coupled to node D, and its gate coupled to node B. An NMOS transistor MRESET2 has its source coupled to ground, its drain coupled to node C, and its gate coupled to node B through the inverter 25.

A SR latch is formed by inverter 27 and 28 and is coupled between nodes C and D. In particular, the inverter 27 has its input coupled to node C and its output coupled to node D, while the inverter 28 has its input coupled to node D and its output coupled to node C.

An OR gate 26 has a first input coupled to node A, a second input to receive a select signal SEL through an inverter 30, a third input coupled to node C, and an output coupled to node E. A PMOS transistor M7 has its source coupled to VDD, its drain providing the CKdec1 signal to the circuit 40 of the pulse decoder 15', and its gate coupled to node E. An NMOS transistor M8 has its source coupled to ground, its drain providing the CKbdec1 signal to the circuit 40 of the pulse decoder 15', and its gate coupled to node E through the inverter 29.

Figure 8:
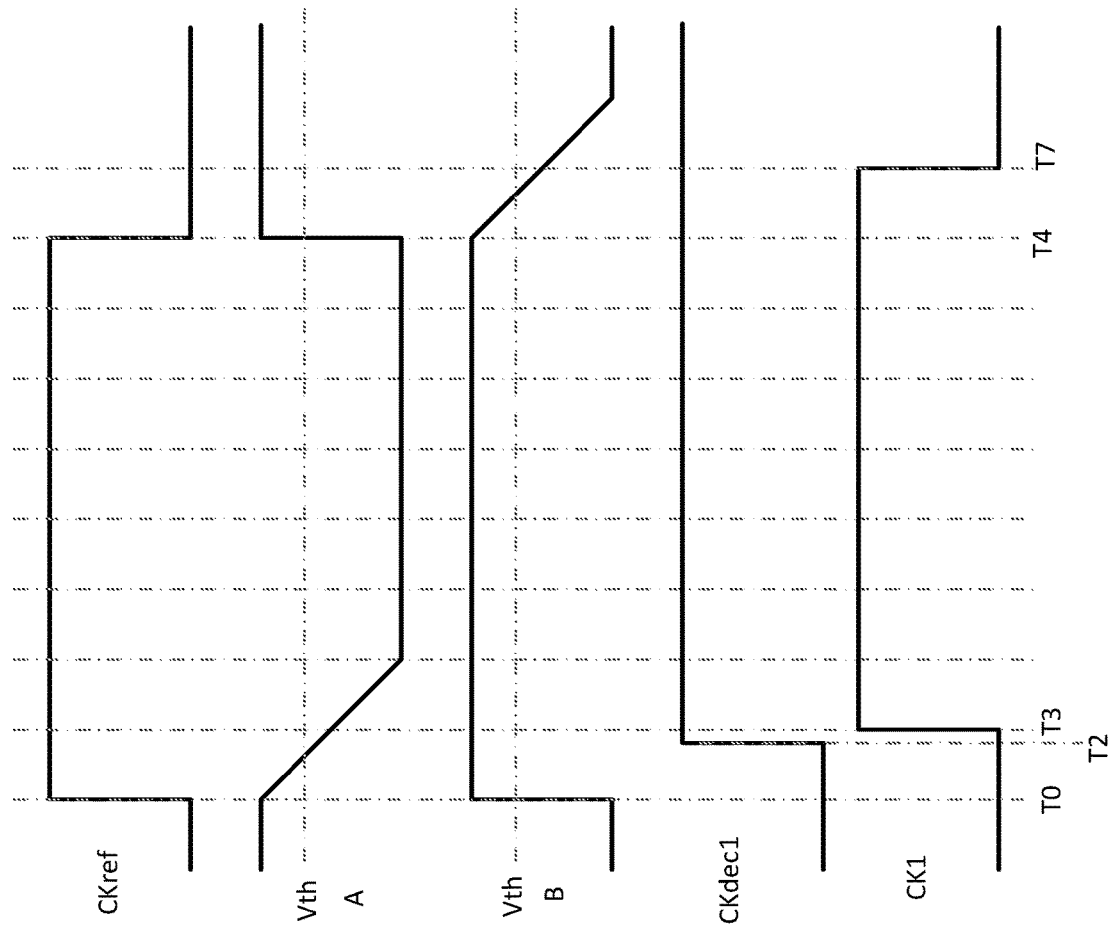
FIG. 8 is a timing diagram showing operation of the delay cell of FIG. 7.

Operation of the delay cell 14''' is now described with reference to FIGS. 7 and 8. To begin this description, initially do not consider the generation of CKdec1 and CKbdec1. When CKref goes high at time T0 (FIG. 8), node A will go down over a time defined by the current provided by the NMOS transistor M3, the capacitance on node A itself, and the threshold to activate the PMOS transistor MSET1 and the NMOS transistor MRESET1. In addition, node B is quickly pulled high, and both the PMOS transistor MSET2 and NMOS transistor MRESET2 are off.

When node A goes down, CK1 is pulled high at time T3 by the PMOS transistor MSET1. Therefore, the previously described delay (plus the delay to flip the SR flip flop formed from inverters 27 and 28) will appear between the rising edges of CKref and CK1 (represented as the interval between times T0 and T3).

When CKref goes low at node T4, node B will go down over a time defined by the current provided by the NMOS transistor M6, the capacitance on node B itself, and the threshold to activate the PMOS transistor MSET2 and the NMOS transistor MRESET2. In addition, node A is quickly pulled high, and both the PMOS transistor MSET1 and NMOS transistor MRESET1 are off.

When node B goes low, CK1 is pulled low at time T7 by the NMOS transistor MRESET2. Therefore, the previously described delay (plus the delay to flip the SR flip flop formed from the inverters 27 and 28) will appear between the falling edges of CKref and CK1 (represented as the interval between T4 and T7).

Now that operation of the delay cell 14''' has been described, consider the operation of the pulse decoder 15' of FIG. 6. As previously described with respect to the rising edge of CKref, when node A goes low between times T0 and T3, a certain time (the time between T0 and T3) is needed for CK1 to be pulled high. During this time, the inputs to the OR gate 26 will be low if SEL is high, and node E will go low to turn on PMOS transistor M7 and NMOS transistor M8.

CKdec1 and CKbdec1 are connected to the nodes N1 and N2 of FIG. 6. When CKdec1 goes high at time T2 and CKbdec1 goes low, the SR flip flop formed by the inverters 41 and 42 will flip, with the result being that node N1 goes high and Pulse$_m$ therefore goes low. As a consequence, when N1 goes high, Pulse$_m$ goes high. This completes the generation of the rising edge of Pulse$_m$.

Another delay will be selected in the delay cell (via the select signal SEL in FIG. 7). For this delay, CKndec will be connected to node N2 and CKbndec will be connected to N1. When CK(n−1) goes high, the rising edge starting from CKref is moving across the delay chain 14′″. With the same behavior previously described, CKndec will go high (and CKbndec will go low). Due to the opposite connection of nodes N1 and N2, node N2 is pulled high and so node N1 and Pulse$_m$ are pulled down. This completes the generation of the falling edge of Pulse$_m$.

As can be seen, the generation of Pulse$_m$ is dependent upon how CKndec and CKbdec are connected to nodes N1 or N2. Note that the flip flop formed by the inverters 41 and 42 is in hold mode for the majority of operation. Only for very short intervals (when the OR gate 26 is driving node E low) is the flip flop forced to the Set or Reset state, depending on the connection of CKndec and CKbndec to nodes N1 or N2.

So, practically, the connection of the delay cells 14A . . . 14N, 14A′ . . . 14N′ and their selection by their related select SEL signals (with it being understood that each delay cell has its own SEL value, and only two of the delay cells will have their select signals SEL asserted) allows defining the shape of Pulse$_m$ (in terms of pulse width and position inside the period of CKref). Note that in the topology described in FIG. 6 and FIG. 7, the basic idea of FIG. 4 is implemented. In fact, the delay path between CKref and CK1 includes more or less the same logic gates as (and so is approximately equal to) the path from CKref and Pulse$_m$. In detail, the SR flip flop formed by inverters 27 and 28 is emulated by the SR flip flop formed from inverters 41 and 42, and the PMOS transistor M7 and the NMOS transistor M8 are emulating the PMOS transistors MSET1, MSET2 and the NMOS transistors MRESET1, MRESET2. Stated again, the edges of Pulse$_m$ are well representing the effective CKn edges (and thus the effective n/N division of the clock period).

Since both the rising edge of CK1 and the falling edge of CK1 (as well as those of CKb1) have been produced by the falling ramps of the respective NMOS transistors M3 and M6 of the CMOS inverters 52 and 52, the delays generated between times T0 and T3, and between times T4 and T7 are 1/N, as intended. This avoids potential mismatch issues in relying on a PMOS to trigger generation of one edge of CK1 and relying on an NMOS to trigger operation of the next edge of CK1. This provides the additional benefit of making the delay cells 14′″ duty-cycle insensitive, meaning that they can operate at duty cycles up to and including (1−(1/N))*100%.

Figure 9:
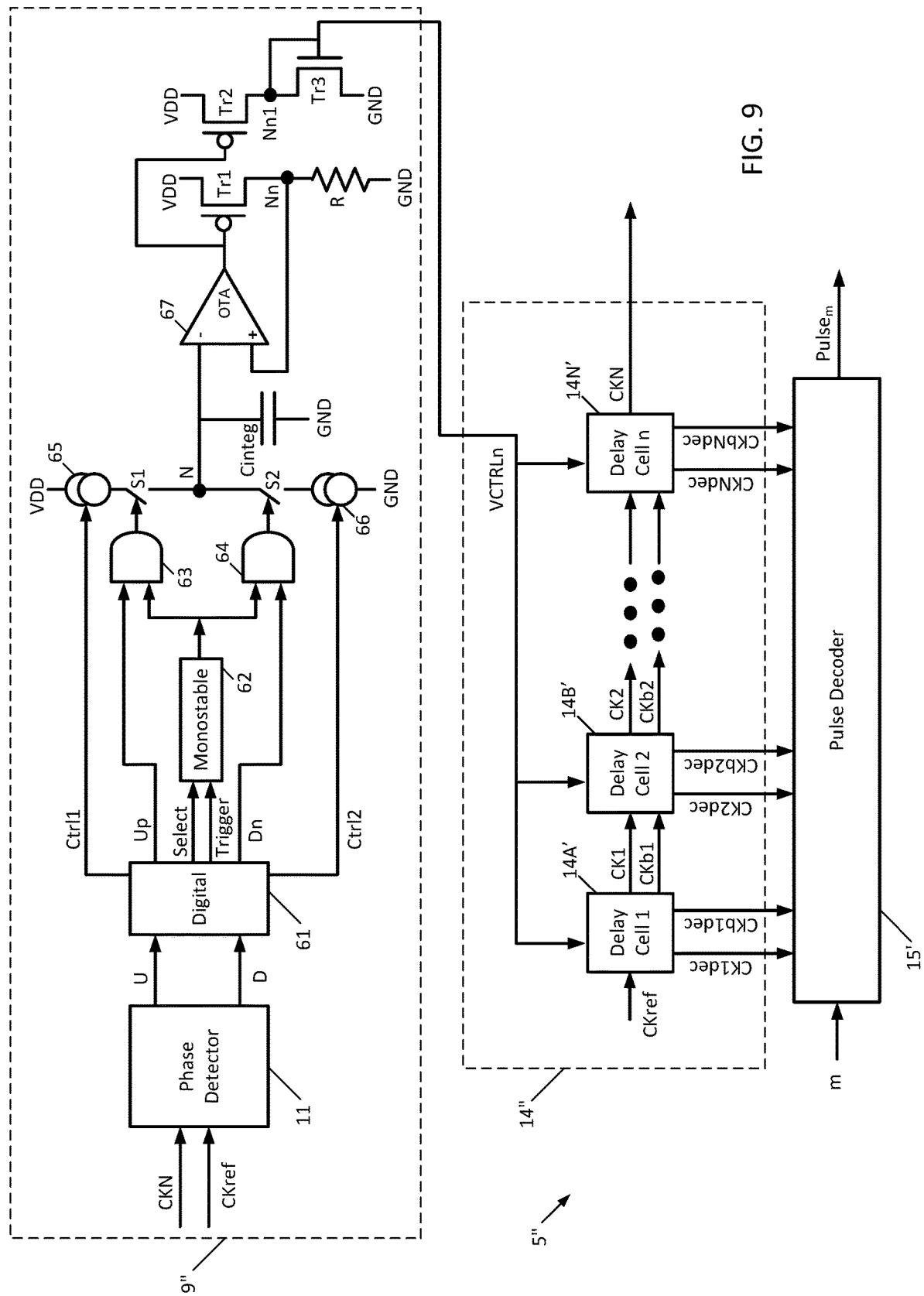
FIG. 9 is a schematic block diagram of an alternate design of circuit for generating a pulsed signal that has a pulse width equal to a desired fraction of a pulse width of a reference clock signal.

Now described with reference to FIG. 9 is another alternate DLL 5″. This DLL 5″ is similar to the DLL 5′, with the exception being that the structure and operation of the control loop 9″ are different. Therefore, this description will focus on the control loop 9″, as the other components of the DLL 5″ remain unchanged compared to the DLL 5′.

The control loop 9 receives the reference clock CKref together with CKN and generates the control signal VCTRLn in a fashion to keep phase alignment between CKref and CKN. In greater detail, the control loop 9 includes a phase detector 11 receiving CKN and the reference clock CKref, which generates control signals U/D for a digital filtering block 61 that generates control signals Up and Dn, as well as a select signal Select and a trigger signal Trigger. A monostable 62 receives the select signal Select and trigger signal Trigger, and provides output to the AND gates 63, 64. The digital filtering block 61 provides the control signal Up to the AND gate 63, and provides the control signal Dn to the AND gate 64. The digital filtering block 61 also provides the control signal Ctrl1 to the current source 65 and the control signal Ctrl2 to the current source 66 to control the magnitude of current outputs of these current sources 65, 66.

The current source 65 is arranged as a current source and is selectively coupled to an integration capacitor Cinteg through switch S1, which is controlled by the output of the AND gate 63. Similarly, the current source 66 is arranged as a current sink and is selectively coupled to an integration capacitor Cinteg through switch S2, which is controlled by the output of the AND gate 64. The integration capacitor Cinteg is coupled between the center tap N between switches S1 an S2, and ground.

An operational transconductance amplifier (OTA) 67 has an inverting terminal coupled to node N, a non-inverting terminal coupled to node Nn, and an output. A PMOS transistor Tr1 has a source coupled to the supply voltage VDD, a drain coupled to node Nn, and a gate coupled to receive the output of the OTA 67. A resistor R is coupled between node Nn and ground. Another PMOS transistor Tr2 has a source coupled to the supply voltage VDD, a drain coupled to diode coupled transistor Tr3 at node Nn1, and a gate also coupled to the output of the OTA 67. The control signal VCTRLn is produced at node Nn1.

In operation, the phase detector 11 compares the phase of the delayed clock signal CKN to the reference clock CKref. If the phase of the delayed clock signal CKN lags that of the reference clock CKref, the phase detector 11 asserts the control signal U, whereas if the phase of the delayed clock signal CKN leads that of the reference clock, the phase detector 11 asserts the control signal D. If the control loop 9 has not yet locked, the digital filtering block 61 asserts the select and trigger signals Select, Trigger, causing the monostable 62 to generate an asserted pulse for a given period of time. This asserted pulse, together with either the control signal Up or the control signal Dn being asserted by the digital filtering block 61, causes the AND gate 63, 64 receiving the asserted control signal Up or Dn to appropriately close the switch S1 or S2.

Therefore, if the phase of the delayed clock signal CKN lags that of the reference clock CKref, the control signal U will be asserted by the phase detector 11 and the control signal Up will be asserted by the digital filtering block 61, and therefore when the monostable 62 asserts its output, the AND gate 63 will cause the switch S1 to close, sourcing current from the current source 65 to the integration capacitor Cinteg to raise the voltage across the integration capacitor Cinteg. As the voltage across the integration capacitor Cinteg at node N increases, the magnitude of the output current of the OTA 67 increases, ultimately increasing the current sourced to node Nn1 by the drain of PMOS transistor Tr2, and therefore increasing the voltage VCTRLn. This ultimately serves to increase the magnitude of the slope of decay of the CMOS inverters 51, 52 when pulling their outputs low at nodes A and B (FIG. 7).

As a corollary, if the phase of the delayed clock signal CKN leads that of the reference clock CKref, the control signal D will be asserted by the phase detector 11 and the control signal Dn will be asserted by the digital filtering block 61, and therefore when the monostable 62 asserts its output, the AND gate 64 will cause the switch S2 to close, sinking current from the current source 66 from the integration capacitor Cinteg to lower the voltage across the integration capacitor Cinteg. As the voltage across the integration capacitor Cinteg at node N decreases, the magnitude of the output current of the OTA 67 lowers, ultimately decreasing the current sourced to node Nn1 by the drain of PMOS transistor Tr2, and therefore decreasing the voltage VCTRLn. This ultimately serves to decrease the magnitude of the slope of decay of the CMOS inverters 51, 52 when pulling their outputs low at nodes A and B (FIG. 7).

As these operations cause the control loop 9 to approach lock, the phase difference between the delayed clock signal CKN and reference clock CKref becomes low. Due to noise, the phase detector 11 will end up issuing a rapid sequence of assertions of the U and D control signals, with the end result being that the control loop 9 oscillates around lock.

To filter out the above described noise, the digital filtering block 61 cumulates total assertions of the control signals U, D received over K periods of the reference clock CKref and decides how to proceed accordingly dependent upon total assertions of U and total assertions of D. For example, this may be performed dependent upon a ratio of the total assertions of U and the total assertions of D over K periods of CKref. This may also be performed dependent upon a comparison between these totals in order to determine whether to assert the control signal Up to the AND gate 63 or to assert the control signal Dn to the AND gate 64. For example, if (Number Of Assertions of D)−(Number Of Assertions of U)>32, then the digital filtering block 61 asserts the Dn signal to the AND gate 64, and if (Number Of Assertions of U)−(Number Of Assertions of D)>32, then the digital filtering block 61 asserts the Up signal to the AND gate 63. If these differences are less than this, then the digital filtering block 61 asserts neither Up nor Dn. In this case, the digital filtering block 61 may alter control signals Ctrl1 and/or Ctrl2 that control the current sources 65 and 66 so as to change the magnitude of the currents produced by the current sources 65 and 66, therefore changing the voltage steps produced on Cinteg when the switches S1 and S2 are closed and in turn changing VCTRLn. This may be performed until lock is acceptably achieved. The comparisons may be performed to suitable values other than 32.

While the disclosure has been described with respect to a limited number of embodiments, those skilled in the art, having benefit of this disclosure, will appreciate that other embodiments can be envisioned that do not depart from the scope of the disclosure as disclosed herein. Accordingly, the scope of the disclosure shall be limited only by the attached claims.

The invention claimed is:

1. A delay locked loop, comprising:
a control loop configured to receive a reference clock signal and a feedback clock signal, and to generate first and second biasing voltages based thereupon;
a delay chain configured to receive the reference clock signal, and to generate N successively delayed versions of the reference clock signal, each at a successive tap of the delay chain; and
a pulse decoder configured to generate a pulsed output signal having a pulse width equal to a desired fraction of a pulse width of the reference clock signal by selecting taps of the delay chain for use as input;
wherein the delay chain comprises N delay cells;
wherein each nth delay cell of the N delay cells comprises, with n being an integer between 1 and N:
a delay block configured to receive an (n−1)th delay output signal and generate an nth delayed signal equal to the reference clock signal delayed by n/N of the reference clock signal minus an additional delay, wherein if (n−1) is equal to zero, the delay block is instead configured to receive the reference clock signal;
a dummy block comprising:
a circuit configured to receive the nth delayed signal, and output the nth delayed signal at an nth tap of the delay chain; and
a dummy logic configured to receive the nth delayed signal from the circuit and add the additional delay thereto, the additional delay being a function of a delay time in the pulse decoder, and to generate an nth delay output signal equal to the nth delayed signal as delayed by the additional delay; and
wherein the feedback clock signal is the Nth delay output signal.

2. The delay locked loop of claim 1, wherein the pulse decoder is also configured to receive an input integer m; and wherein the desired fraction is m/N.

3. The delay locked loop of claim 1, wherein the circuit configured to receive the nth delayed signal, and output the nth delayed signal at an nth tap of the delay chain is a buffer circuit configured to receive the nth delayed signal, buffer the nth delayed signal, and output the nth delayed signal at an nth tap of the delay chain.

4. The delay locked loop of claim 1, wherein the delay block of each nth delay cell comprises:
a first current source transistor configured to be biased by the first biasing voltage and configured to generate a first bias current;
a second current source transistor configured to be biased by the second biasing voltage and configured to generate a second bias current;
an inverter comprising an inverter PMOS transistor having a source coupled to the first current source transistor to receive the first bias current and a gate configured to receive the (n−1)th delay output signal, and an inverter NMOS transistor having a drain coupled to a drain of the inverter PMOS transistor, a source coupled to the second current source transistor to receive the second bias current, and a gate configured to receive the (n−1)th delay output signal, the inverter configured to generate the nth delayed signal at the drains of the inverter PMOS transistor and inverter NMOS transistor; and
a psuedo-inverter comprising a psuedo-inverter PMOS transistor having a source coupled to the first current source transistor to receive the first bias current, a drain coupled to ground, and a gate configured to receive a complement of the (n−1)th delay output signal, and a psuedo-inverter NMOS transistor having a drain coupled to a supply voltage, a source coupled to the second current source transistor to receive the second bias current, and a gate configured to receive the complement of the (n−1)th delay output signal.

5. A delay locked loop, comprising:
a control loop configured to receive a reference clock signal and a feedback clock signal, and to generate a first biasing voltage based thereupon;
a delay chain configured to receive the reference clock signal, and to generate N successively delayed versions of the reference clock signal, each at a successive tap of the delay chain; and
a pulse decoder configured to generate a pulsed output signal having a pulse width equal to a desired fraction of a pulse width of the reference clock signal by selecting taps of the delay chain for use as input;
wherein the delay chain comprises N delay cells;
wherein each nth delay cell of the N delay cells comprises, with n being an integer between 1 and N:

a delay circuit biased by the first biasing voltage and configured to:
receive an (n−1)th delay output signal and generate an nth delayed signal equal to the reference clock signal delayed by n/N of the reference clock signal minus an additional delay, wherein if (n−1) is equal to zero, the delay circuit is instead configured to receive the reference clock signal;
output the nth delayed signal at an nth tap of the delay chain; and
add the additional delay to the nth delayed signal, the additional delay being a function of a delay time in the pulse decoder, and generate an nth delay output equal to the nth delayed signal as delayed by the additional delay; and
wherein the feedback clock signal is the Nth delay output signal.

6. The delay locked loop of claim 5, wherein the delay circuit of each nth delay cell comprises:
a first current source transistor configured to be biased by the first biasing voltage and configured to generate a first bias current;
a second current source transistor configured to be biased by the first biasing voltage and configured to generate a second bias current;
a first inverter comprising:
a first inverter PMOS transistor having a source coupled to a supply voltage and a gate configured to receive the (n−1)th delay output signal; and
a first inverter NMOS transistor having a drain coupled to a drain of the first inverter PMOS transistor, a source coupled to the first current source transistor to receive the first bias current, and a gate configured to receive the (n−1)th delay output signal;
wherein the first inverter is configured to generate a first decaying ramped signal in response to assertion of the (n−1)th delay output signal;
a second inverter comprising:
a second inverter PMOS transistor having a source coupled to the supply voltage and a gate configured to receive a complement of the (n−1)th delay output signal; and
a second inverter NMOS transistor having a drain coupled to a drain of the first inverter PMOS transistor, a source coupled to the second current source transistor to receive the second bias current, and a gate configured to receive the complement of the (n−1)th delay output signal;
wherein the second inverter is configured to generate a second decaying ramped signal in response to assertion of complement of the (n−1)th delay output signal; and
circuitry configured to begin generation of a rising edge of the nth delay output signal when the first decaying ramped signal falls below a threshold voltage, and to begin generation of a falling edge of the nth delay output signal when the second decaying ramped signal falls below the threshold voltage.

7. The delay locked loop of claim 6, wherein the first and second bias currents are equal, and have a magnitude such that, when the (n−1)th delay output signal is asserted, the first inverter generates the first decaying ramped signal but the second inverter generates a first rising edge, and when the (n−t)th delay output signal is deasserted, the second inverter generates the second decaying ramped signal but the first inverter generates a second rising edge, a magnitude of a slope of the first decaying ramped signal being less than a magnitude of a slope of the first rising edge, a magnitude of a slope of the second decaying ramped signal being less than a magnitude of a slope of the second rising edge.

8. The delay locked loop of claim 6, wherein the circuitry comprises:
a first set PMOS transistor having a source coupled to the supply voltage, a gate coupled to the drain of the first inverter PMOS transistor and the drain of the first inverter NMOS transistor, and a drain coupled to a first common node;
a first reset NMOS transistor having a drain coupled to a second common node, a gate coupled to the drain of the first inverter PMOS transistor and the drain of the first inverter NMOS transistor through an inverter, and a source coupled to ground;
a second set PMOS transistor having a source coupled to the supply voltage, a gate coupled to the drain of the second inverter PMOS transistor and the drain of the second inverter NMOS transistor, and a drain coupled to the second common node;
a second reset NMOS transistor having a source coupled to the first common node, a gate coupled to the drain of the second inverter PMOS transistor and the drain of the second inverter NMOS transistor through an inverter, and a source coupled to ground;
wherein the nth delay output signal is generated at the first common node;
wherein a complement of the nth delay output signal is generated at the second common node; and
a SR latch having a set input coupled to the first common node and a reset input coupled to the second common node.

9. The delay locked loop of claim 8, wherein the delay circuit of each nth delay cell further comprises:
an OR gate having a first input coupled to the drain of the first inverter PMOS transistor and the drain of the first inverter NMOS transistor, a second input coupled to a select signal through an inverter, a third input coupled to the first common node, and an output;
a PMOS transistor having a source coupled to the supply voltage, a gate coupled to the output of the OR gate, and a drain at which the nth delayed signal is generated; and
an NMOS transistor having a source coupled to ground, a gate coupled to the output of the OR gate through an inverter, and a drain at which a complement of the nth delayed signal is generated.

10. The delay locked loop of claim 9, wherein the pulsed output signal is produced to have a pulse width equal to a desired fraction of a pulse width of the reference clock signal by generating a rising edge and a falling edge; wherein each of the N delay cells is either used to produce the rising edge or to produce the falling edge, with a total number of the N delay cells used to produce the rising edge indicating a delay between start of the period of the reference clock signal and the rising edge, and with a total number of the N delay cells used to produce the falling edge indicating a delay between the falling edge and end of the period of the reference clock signal; and wherein the pulse decoder comprises:
a circuit configured to:
select a first series of taps representing the delayed signals respectively produced by each of the N delay cells used to produce the rising edge of the pulsed output signal;
select a second series of taps representing complements of the delayed signals respectively produced by each of the N delay cells used to produce the rising edge of the pulsed output signal;

select a third series of taps representing the delayed signals respectively produced by each of the N delay cells used to produce the falling edge of the pulsed output signal; and select a fourth series of taps representing complements of the delayed signals respectively produced by each of the N delay cells used to produce the falling edge of the pulsed output signal; and a SR latch having a set input coupled to the first series of taps and the fourth series of taps, a reset input coupled to the second series of taps and the third series of taps, and an output producing the pulsed output signal through a buffer.

11. The delay locked loop of claim 10, wherein a delay cell of the N delay cells associated with a last of the first series of taps receives an asserted version of the select signal; wherein a delay cell of the N delay cells associated with a first of the third series of taps receives an asserted version of the select signal; and wherein remaining ones of the N delay cells receive a deasserted version of the select signal.

12. The delay locked loop of claim 5, wherein the control loop comprises:

a phase detector configured to receive the reference clock signal and the feedback clock signal, to assert an up signal in response to a phase of the feedback clock signal lagging a phase of the reference clock signal, and to assert a down signal in response to the phase of the feedback clock signal leading the phase of the reference clock signal;

a digital filtering block configured to receive the up and down signals, to count a number of assertions of the up signal during a plurality of periods of the reference clock signal, to count a number of assertions of the down signal during the plurality of periods of the reference clock signal, to compare the number of assertions of the up signal during the plurality of periods of the reference clock signal to the number of assertions of the down signal during the plurality of periods of the reference clock signal, and to then assert an up command signal or a down command signal based upon the comparison; and a biasing voltage generation circuit configured to receive the up command signal and down command signal, and to generate the first biasing voltage based thereupon.

13. The delay locked loop of claim 5, wherein the control loop comprises:

a phase detector configured to receive the reference clock signal and the feedback clock signal, to assert an up signal in response to a phase of the feedback clock signal lagging a phase of the reference clock signal, and to assert a down signal in response to the phase of the feedback clock signal leading the phase of the reference clock signal;

a digital filtering block configured to receive the up and down signals, to count a number of assertions of the up signal during a plurality of periods of the reference clock signal, to count a number of assertions of the down signal during the plurality of periods of the reference clock signal, to compare the number of assertions of the up signal during the plurality of periods of the reference clock signal to the number of assertions of the down signal during the plurality of periods of the reference clock signal, and to then assert an up command signal or a down command signal based upon the comparison;

wherein the digital filtering block is further configured to assert a trigger signal substantially simultaneously with asserting the up command signal or the down command signal;

a monostable configured to receive the trigger signal, and to assert its output in a pulse based upon receipt of the trigger signal;

a first AND gate configured to receive the up command signal and the output of the monostable, and to generate a first switch control signal as a result of a logical AND operation therebetween;

a second AND gate configured to receive the down command signal and the output of the monostable, and to generate a second switch control signal as a result of a logical AND operation therebetween;

an integration capacitor coupled between a node and ground;

a current source;

a first switch configured to selectively couple the integration capacitor to the current source in response to assertion of the first switch control signal;

a current sink;

a second switch configured to selectively couple the integration capacitor to the current sink in response to assertion of the second switch control signal;

an operational transconductance amplifier having an inverting terminal coupled to the node, a non-inverting terminal coupled to a second node, and an output;

a resistor coupled between the second node and ground;

a first PMOS transistor having a source coupled to a supply voltage, a drain coupled to the second node, and a gate coupled to the output of the operational transconductance amplifier; and a second PMOS transistor having a source coupled to the supply voltage, a drain coupled to a diode coupled NMOS transistor to produce the first biasing voltage, and a gate coupled to the output of the operational transconductance amplifier.

14. The delay locked loop of claim 13, wherein the digital filtering block is further configured to generate a current source control signal for the current source based upon the comparison of the number of assertions of the up signal during the plurality of periods of the reference clock signal to the number of assertions of the down signal during the plurality of periods of the reference clock signal, and to generate a current sink control signal for the current sink based upon the comparison of the number of assertions of the up signal during the plurality of periods of the reference clock signal to the number of assertions of the down signal during the plurality of periods of the reference clock signal.

15. A delay locked loop, comprising:

a control loop configured to receive a reference clock signal and a feedback clock signal, and to generate at least one biasing voltage based thereupon;

a delay chain configured to receive the reference clock signal, and to generate N successively delayed versions of the reference clock signal, each at a successive tap of the delay chain, wherein the Nth delayed version of the reference clock signal is the feedback clock signal; and wherein the control loop comprises:

a phase detector configured to receive the reference clock signal and the feedback clock signal, to assert an up signal in response to a phase of the feedback clock signal lagging a phase of the reference clock signal, and to assert a down signal in response to the phase of the feedback clock signal leading the phase of the reference clock signal;

a digital filtering block configured to receive the up and down signals, to count a number of assertions of the up signal during a plurality of periods of the reference clock signal, to count a number of assertions of the down signal during the plurality of periods of the reference clock signal, to compare the number of assertions of the up signal during the plurality of periods of the reference clock signal to the number of assertions of the down signal during the plurality of periods of the reference clock signal, and to then assert an up command signal or a down command signal based upon the comparison; and a biasing voltage generation circuit configured to receive the up command signal and down command signal, and to generate the at least one biasing voltage based thereupon.

16. The delay locked loop of claim 15, wherein the digital filtering block is further configured to assert a trigger signal substantially simultaneously with asserting the up command signal or the down command signal; and wherein the biasing voltage generation circuit comprises:
a monostable configured to receive the trigger signal, and to assert its output in a pulse based upon receipt of the trigger signal;
a first AND gate configured to receive the up command signal and the output of the monostable, and to generate a first switch control signal as a result of a logical AND operation therebetween;
a second AND gate configured to receive the down command signal and the output of the monostable, and to generate a second switch control signal as a result of a logical AND operation therebetween;
an integration capacitor coupled between a node and ground;
a current source;
a first switch configured to selectively couple the integration capacitor to the current source in response to assertion of the first switch control signal;
a current sink;
a second switch configured to selectively couple the integration capacitor to the current sink in response to assertion of the second switch control signal;
an operational transconductance amplifier having an inverting terminal coupled to the node, a non-inverting terminal coupled to a second node, and an output;
a resistor coupled between the second node and ground;
a first PMOS transistor having a source coupled to a supply voltage, a drain coupled to the second node, and a gate coupled to the output of the operational transconductance amplifier; and
a second PMOS transistor having a source coupled to the supply voltage, a drain coupled to a diode coupled NMOS transistor to produce the at least one biasing voltage, and a gate coupled to the output of the operational transconductance amplifier.

17. The delay locked loop of claim 16, wherein the digital filtering block is further configured to generate a current source control signal for the current source based upon the comparison of the number of assertions of the up signal during the plurality of periods of the reference clock signal to the number of assertions of the down signal during the plurality of periods of the reference clock signal, and to generate a current sink control signal for the current sink based upon the comparison of the number of assertions of the up signal during the plurality of periods of the reference clock signal to the number of assertions of the down signal during the plurality of periods of the reference clock signal.

* * * * *